US010067216B2

(12) United States Patent
Kim

(10) Patent No.: US 10,067,216 B2
(45) Date of Patent: Sep. 4, 2018

(54) SYSTEM FOR CORRECTING ERROR

(71) Applicant: LSIS CO., LTD., Gyeonggi-do (KR)

(72) Inventor: Dong-Su Kim, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/210,794

(22) Filed: Jul. 14, 2016

(65) Prior Publication Data

US 2017/0016973 A1 Jan. 19, 2017

(30) Foreign Application Priority Data

Jul. 16, 2015 (KR) ........................ 10-2015-0101223

(51) Int. Cl.

| | |
|---|---|
| ***G01R 35/00*** | (2006.01) |
| ***G01R 35/02*** | (2006.01) |
| ***H01F 27/42*** | (2006.01) |
| ***G01R 31/02*** | (2006.01) |
| *G01R 19/25* | (2006.01) |

(52) U.S. Cl.

CPC ......... *G01R 35/005* (2013.01); *G01R 31/027* (2013.01); *G01R 35/02* (2013.01); *H01F 27/427* (2013.01); *G01R 19/2513* (2013.01)

(58) Field of Classification Search

CPC ...... G01R 35/005; G01R 31/02; G01R 35/02; G01R 19/2513

USPC .......................................................... 324/130

See application file for complete search history.

(56) References Cited

U.S. PATENT DOCUMENTS

| | | | |
|---|---|---|---|
| 8,604,805 | B2 | 12/2013 | Satou et al. |
| 2006/0085144 | A1 | 4/2006 | Slota et al. |

(Continued)

FOREIGN PATENT DOCUMENTS

| | | | | |
|---|---|---|---|---|
| EP | 0984287 | A1 * | 3/2000 | ......... G01R 1/06788 |
| JP | 2001218359 | A | 8/2001 | |
| JP | 2002207058 | A | 7/2002 | |

(Continued)

OTHER PUBLICATIONS

Espacenet English translation Jung et al. KR101326730 (B1), Nov. 8, 2013.*

Search report dated Dec. 13, 2016 for counterpart EP 16176024.4.

*Primary Examiner* — Melissa Koval
*Assistant Examiner* — Courtney McDonnough
(74) *Attorney, Agent, or Firm* — K&L Gates LLP

(57) ABSTRACT

Disclosed embodiments relate to a system for correcting an error, which can correct the error of a measurement device and a transformer data unit through calibration using an emulator even if the measurement device and the transformer data unit are connected in a random combination. In some embodiments, the system for correcting an error includes a measurement device connected to a secondary output line of a transformer to measure current that is output from the transformer, a transformer data unit configured to determine a usage rate and an overload state through calculation of a load amount for a capacity of the transformer in accordance with the current that is measured by the measurement device, and an emulator connected to the measurement device and the transformer data unit to perform error correction between the measurement device and the transformer data unit through performing calibration at least once.

3 Claims, 6 Drawing Sheets

(56) References Cited

U.S. PATENT DOCUMENTS

| | | | |
|---|---|---|---|
| 2007/0007945 | A1 | 1/2007 | King et al. |
| 2012/0217954 | A1 | 8/2012 | Cook |

FOREIGN PATENT DOCUMENTS

| | | | |
|---|---|---|---|
| JP | 2008046067 | A | 2/2008 |
| JP | 2011128041 | A | 6/2011 |
| KR | 2010050042388 | A | 5/2005 |
| KR | 101326730 | B1 | 11/2013 |
| KR | 101509149 | B1 | 4/2015 |
| WO | 0984287 | A1 | 8/2000 |
| WO | 0129572 | A1 | 10/2000 |

* cited by examiner

FIG. 6

| TDU / Probe | ID_$T_1$ | ID_$T_2$ | ···· | ID_$T_N$ |
|---|---|---|---|---|
| ID_$P_1$ | $\alpha_1$ | $\alpha_2$ | ···· | $\alpha_n$ |
| ID_$P_2$ | $\beta_1$ | $\beta_2$ | ···· | $\beta_n$ |
| ⋮ | ⋮ | ⋮ | ⋱ | ⋮ |
| ID_$P_m$ | $\gamma_1$ | $\gamma_2$ | ···· | $\gamma_n$ |

SYSTEM FOR CORRECTING ERROR

CROSS REFERENCE TO RELATED APPLICATIONS

This application claims the benefit of Korean Patent Application No. 10-2015-0101223, filed on Jul. 16, 2015 and entitled "SYSTEM FOR CORRECTING ERROR", which is hereby incorporated by reference in its entirety.

BACKGROUND

Technical Field

The present disclosure relates to a system for correcting an error, and more particularly, to a system for correcting an error, which can correct an error through performing calibration between a transformer data unit and a measurement device in a transformer load monitoring system.

Description of the Related Art

A transformer data unit (TDU) that is provided in a data concentrate unit (DCU) constitutes a transformer load monitoring system together with a measurement device that measures current or voltage from a transformer, for example, a probe.

The transformer load monitoring system calculates power information, such as current for each phase, a voltage, an active power amount, a reactive power amount, and a power factor, in accordance with transformer current and voltage that are transmitted from the measurement device to the transformer data unit, and then transmits the calculated power information to an upper server system to perform real-time transformer monitoring and diagnosis.

The transformer load monitoring system requires accuracy for the calculated power information. For this, the transformer load monitoring system essentially requires calibration for error correction between the transformer data unit and the measurement device.

FIG. 1 is a diagram schematically illustrating the configuration of a transformer load monitoring system in the related art.

Referring to FIG. 1, a transformer load monitoring system 1 in the related art includes a transformer 10, a probe 20, and a transformer data unit 30.

The transformer 10 is installed on an electric pole (not illustrated), and a primary voltage is input to the transformer 10 through a line that is branched from a primary line to which power is transmitted from a substation.

The primary voltage that is input to the transformer 10 is reduced by a voltage reduction circuit (not illustrated) in the transformer 10 to produce a secondary voltage, and the secondary voltage is transmitted to an outside, for example, a consumer, through a secondary line.

The probe 20 is a measurement device that is installed adjacent to the transformer 10 to measure the voltage or current that flows from the transformer 10 to the secondary line.

The transformer data unit 30 is connected to the probe 20 to calculate the power information of the transformer 10 from the voltage or current that is provided from the probe 20. The transformer data unit 30 transmits the calculated power information to an upper system (not illustrated).

As described above, the transformer load monitoring system 1 requires accuracy for the power information, and for this, performs error correction between the probe 20 and the transformer data unit 30.

The transformer load monitoring system 1 corrects an error by performing calibration with respect to self-errors of the transformer data unit 30 and the probe 20 in a state where the transformer data unit 30 and the probe 20 are put into one-to-one correspondence with each other.

In this case, the calibration is performed in a state where the transformer data unit 30 and the probe 20 are not connected to the transformer 10. After completion of the calibration, the transformer data unit 30 and the probe 20 are connected to each other in one-to-one correspondence state.

However, the transformer load monitoring system 1 in the related art has the problem that in the case where one of the transformer data unit 30 and the probe 20 is unexpectedly troubled, it is difficult to replace the troubled constituent element.

That is, since the transformer load monitoring system 1 in the related art performs calibration in a state where the transformer data unit 30 and the probe 20 are connected in one-to-one manner, it is required to replace both of the transformer data unit 30 and the probe 20 by other calibrated transformer data unit and probe even if only one of them is troubled.

Accordingly, the transformer load monitoring system 1 in the related art has the problem that time and cost required for equipment replacement are increased.

SUMMARY

Accordingly, some embodiments of the present disclosure includes been made to solve the above-mentioned problems occurring in the related art, and one subject to be achieved by some embodiments of the present disclosure is to provide a system for correcting an error, which can perform error correction through calibration even if a transformer data unit and a measurement device are connected in a random combination in a transformer load monitoring system.

In accordance with an aspect of some embodiments of the present disclosure, there is provided a system for correcting an error, which includes a measurement device connected to a secondary output line of a transformer to measure current that is output from the transformer; a transformer data unit configured to determine a usage rate and an overload state through calculation of a load amount for a capacity of the transformer in accordance with the current that is measured by the measurement device; and an emulator connected to the measurement device and the transformer data unit to perform error correction between the measurement device and the transformer data unit through performing calibration at least once.

The emulator may calibrate the measurement device and the transformer data unit with respect to at least three points within a current measurement range.

The current measurement range may be 0 to 760 A, and the three points may be points of 5 A, 150 A, and 650 A.

The system for correcting an error may further include a first memory in which a measurement device ID is stored; a second memory in which a transformer data unit ID is stored; and a lookup table in which characteristic values according to the measurement device ID and the transformer data unit ID are stored.

The emulator may extract one characteristic value which corresponds to the measurement device ID and the transformer data unit ID among the characteristic values of the lookup table, and may calibrate the measurement device and the transformer data unit using the one characteristic value.

The system for correcting an error according to some embodiments of the present disclosure can correct the error of the measurement device and the transformer data unit through the calibration using the emulator even if the measurement device and the transformer data unit are connected in the random combination, and thus it becomes possible to replace only one of the measurement device and the transformer data unit.

Through this, the system for correcting an error according to some embodiments of the present disclosure can reduce the time consumption and the cost occurrence that are required when the measurement device or the transformer data unit is replaced.

BRIEF DESCRIPTION OF DRAWINGS

FIG. 6 is a diagram exemplifying a lookup table of an emulator, according to an embodiment of the present disclosure.

DETAILED DESCRIPTION

Hereinafter, embodiments of the present disclosure will be described in detail with reference to the accompanying drawings. It should be understood that the present disclosure is not limited to the following embodiments, and that the embodiments are provided for illustrative purposes only. The scope of the disclosure should be defined only by the accompanying claims and equivalents thereof.

Figure 1:
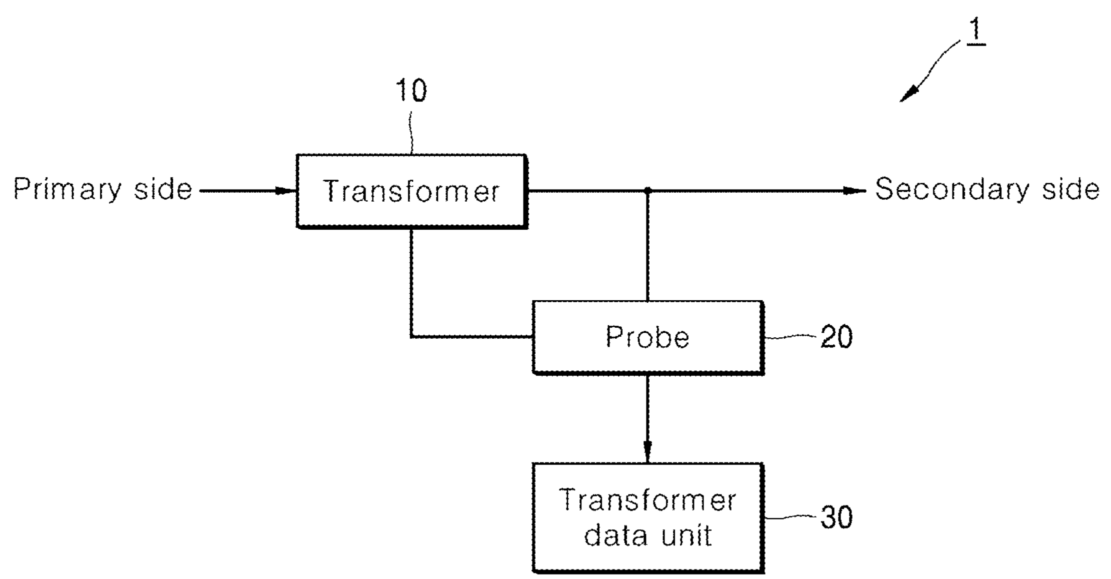
FIG. 1 is a diagram schematically illustrating the configuration of a transformer load monitoring system in the prior art.
Figure 2:
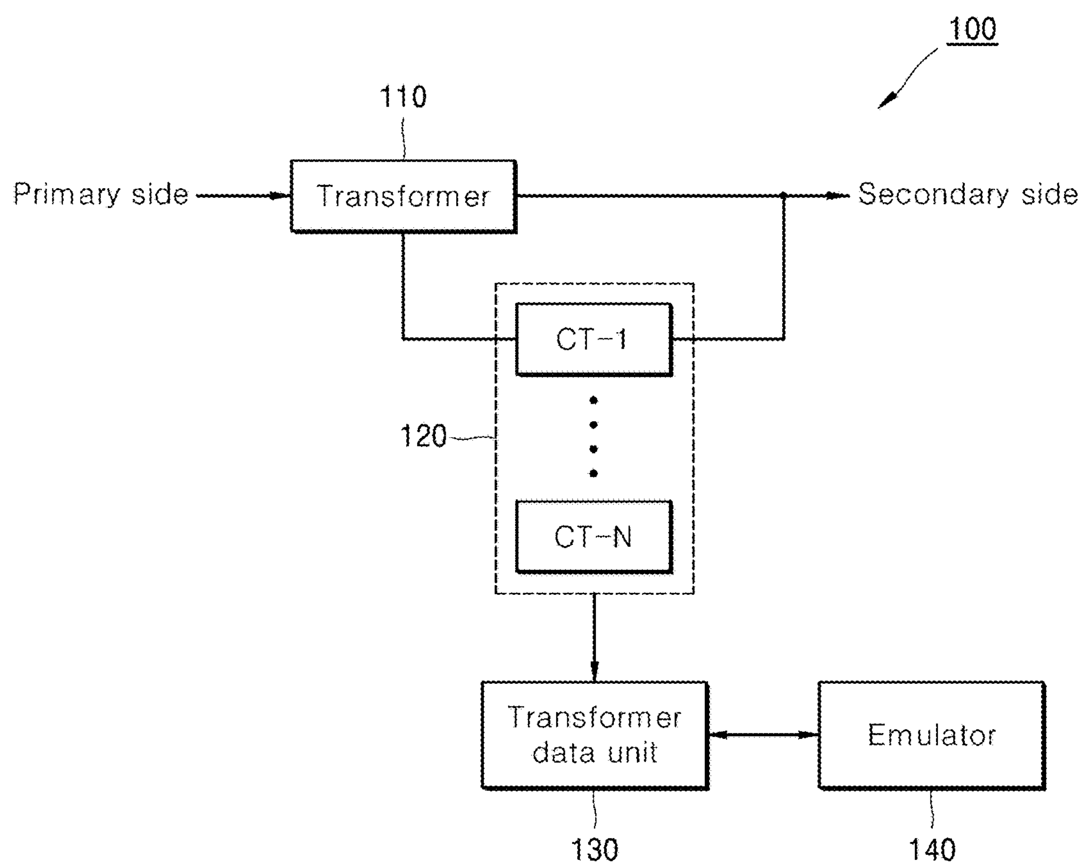
FIG. 2 is a diagram schematically illustrating the configuration of a system for correcting an error according to an embodiment of the present disclosure.

FIG. 2 is a diagram schematically illustrating the configuration of a system for correcting an error according to an embodiment of the present disclosure.

Referring to FIG. 2, a system 100 for correcting an error according to this embodiment may include a transformer 110, a measurement device module 120, a transformer data unit 130, and an emulator 140.

The transformer 110, which is installed on an electric pole (not illustrated), reduces a primary voltage that is provided from a primary line that passes through the electric pole to generate a secondary voltage, and may output the secondary voltage to a consumer through a secondary line.

The measurement device module 120 can measure an output of the transformer 110, that is, current that flows from the transformer 110 to the secondary line.

The measurement device module 120 may include a plurality of measurement devices CT_1 to CT_N, for example, a plurality of current measurement probes. One of the plurality of measurement devices CT_1 to CT_N may be connected to the transformer data unit 130 to be described later through a wired/wireless method.

The transformer data unit 130 may calculate information on the transformer 110, for example, a load amount for the capacity of the transformer 110, from the current value of the transformer 110 that is provided from the measurement device module 120. Further, the transformer data unit 130 may determine the usage rate and an overload state of the transformer 110 on the basis of the load amount for the capacity of the transformer 110. The transformer data unit 130 may be connected to one of the plurality of measurement devices CT_1 to CT_N of the measurement device module 120 to receive the current value of the transformer 110.

The emulator 140 may be connected to the transformer data unit 130 in a wired/wireless method to perform error correction between the transformer data unit 130 and the measurement devices CT_1 to CT_N connected thereto.

The emulator 140 can correct an error of the transformer data unit 130 and the measurement devices CT_1 to CT_N through calibration. The emulator 140 may be composed of a computer including an embedded calibration program, and can correct the error of the transformer data unit 130 and the measurement devices CT_1 to CT_N through performing calibration at least once.

On the other hand, FIG. 2 illustrates that the system 100 for correcting an error is provided with the measurement device module 120 including the plurality of measurement devices CT_1 to CT_N, but is not limited thereto.

For example, the system 100 for correcting an error according to some embodiments of the present disclosure may be composed of one measurement device CT_1 to CT_N and one transformer data unit 130, or may be composed of one measurement device CT_1 to CT_N and a plurality of transformer data units 130.

That is, the system 100 for correcting an error according to some embodiments of the present disclosure as illustrated in FIG. 2 is configured to correct an error by performing the calibration through the emulator 140 in a state where the transformer data unit 130 and the measurement devices CT_1 to CT_N are connected in a random combination.

Figure 3:
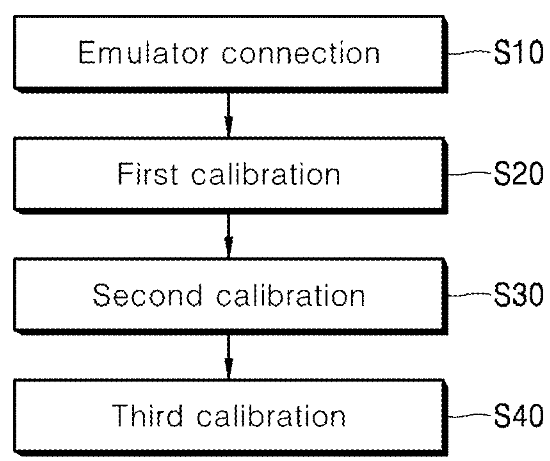
FIG. 3 is a flowchart illustrating the operation of the system for correcting an error illustrated in FIG. 2, according to an embodiment of the present disclosure.

FIG. 3 is a flowchart illustrating the operation of the system for correcting an error illustrated in FIG. 2.

Referring to FIGS. 2 and 3, one of the plurality of measurement devices CT_1 to CT_N that are provided in the measurement device module 120 is first connected to the transformer data unit 130, and then the emulator 140 is connected to the transformer data unit 130 (S10).

Then, the emulator 140 performs calibration between the transformer data unit 130 and the measurement devices CT_1 to CT_N connected thereto using an embedded program, and corrects the error of the transformer data unit 130 and the measurement devices CT_1 to CT_N through this. For example, the emulator 140 can correct the error of the transformer data unit 130 and the measurement devices CT_1 to CT_N through three times calibration (S20 to S40).

First, the emulator 140 may correct the error by performing the first calibration at the first point of the current measurement range of the measurement devices CT_1 to CT_N or the transformer data unit 130 (S20). Here, the current measurement range may be 0 to 760 A, and the first point may be a point of 5 A.

In continuation, the emulator 140 may correct the error by performing the second calibration at the second point of the current measurement range (S30). Here, the second point may be a point of 150 A.

Then, the emulator 140 may correct the error by performing the third calibration at the third point of the current measurement range (S40). Here, the third point may be a point of 650 A.

As described above, the system 100 for correcting an error according to this embodiment can correct the error of the transformer data unit 130 and the measurement devices CT_1 to CT_N connected thereto by performing the calibration between the transformer data unit 130 and the measurement devices CT_1 to CT_N using the emulator 140 even if one of the plurality of measurement devices CT_1 to CT_N of the measurement device module 120 is connected to the transformer data unit 130.

According to the system 100 for correcting an error according to some embodiments of the present disclosure, in comparison to the system in the related art, it is possible to replace only one of the transformer data unit 130 and the measurement devices CT_1 to CT_N, and thus the time consumption and the cost occurrence caused by the replacement can be reduced.

Figure 4:
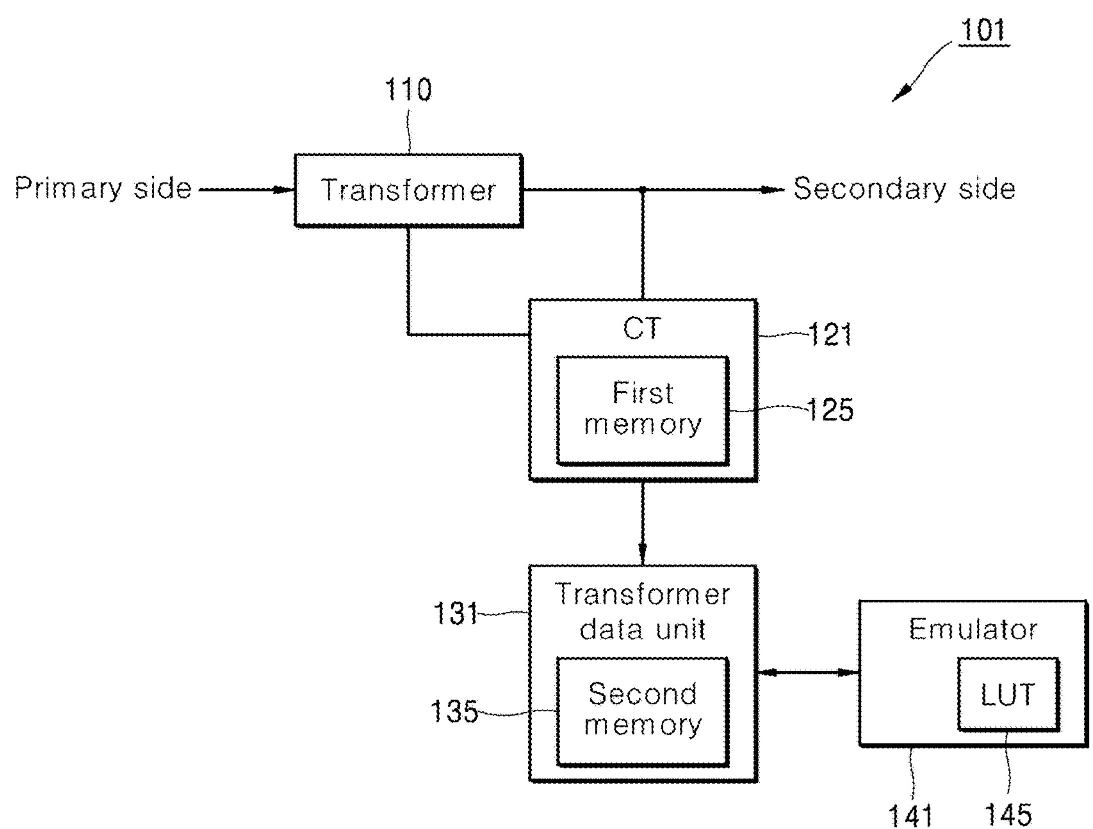
FIG. 4 is a diagram schematically illustrating the configuration of a system for correcting an error according to another embodiment of the present disclosure.

FIG. 4 is a diagram schematically illustrating the configuration of a system for correcting an error according to another embodiment of the present disclosure.

Referring to FIG. 4, a system 101 for correcting an error according to this embodiment may include a transformer 110, a measurement device 121, a transformer data unit 131, and an emulator 141.

The transformer 110 is the same as the transformer as described above with reference to FIG. 2, and reduces a primary voltage that is provided through a primary line to generate a secondary voltage, and outputs the secondary voltage through a secondary line.

The measurement device 121 can measure an output of the transformer 110, and can output the measured current to the transformer data unit 131.

The measurement device 121 may include a first memory 125. Inherent ID information of the measurement device 121 may be stored in the first memory 125.

The transformer data unit 131 may calculate a load amount for the capacity of the transformer 110, from the current value that is provided from the measurement device 121, and may determine the usage rate and an overload state of the transformer 110 based on this.

The transformer data unit 131 may include a second memory 135. Inherent ID information of the transformer data unit 131 may be stored in the second memory 135.

The emulator 141 may be connected to the transformer data unit 131 to perform error correction between the transformer data unit 131 and the measurement device 121. The emulator 141 can correct an error of the transformer data unit 131 and the measurement device 121 through performing calibration at least once.

The emulator 140 may include a lookup table 145. In the lookup table, characteristic values for calibration between the transformer data unit 131 and the measurement device 121 may be stored.

The emulator 141 may detect the measurement device ID from the first memory 125 of the measurement device 121, and may detect the transformer data unit ID from the second memory 135 of the transformer data unit 131. Further, the emulator 141 may extract the characteristic values corresponding to the measurement device ID and the transformer data unit ID from the lookup table 145, and may perform calibration between the transformer data unit 131 and the measurement device 121 using the extracted characteristic value.

On the other hand, in this embodiment, the memory is provided in the measurement device 121 and the transformer data unit 131, and the measurement device ID and the transformer data unit ID are stored in the memory, but are not limited thereto.

For example, the measurement device ID and the transformer data unit ID may be in the form of barcodes, and such IDs may be attached to outer surfaces of the measurement device 121 and the transformer data unit 131. Further, the emulator 141 may be acquired the measurement ID and the transformer data unit ID by recognizing the barcode through a reader or the like.

Figure 5:
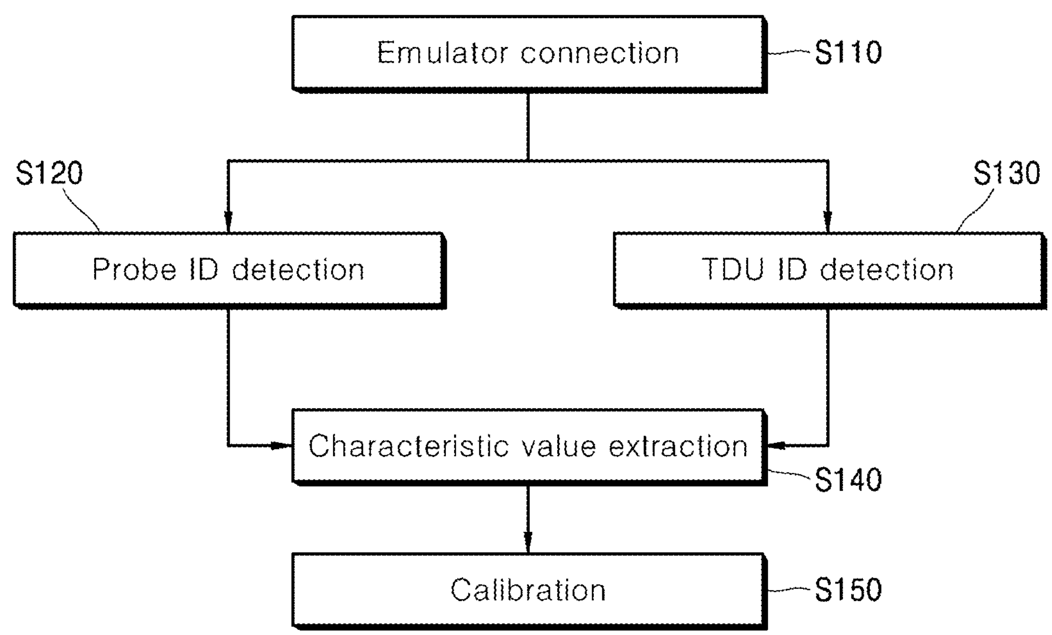
FIG. 5 is a flowchart illustrating the operation of the system for correcting an error illustrated in FIG. 4.

FIG. 5 is a flowchart illustrating the operation of the system for correcting an error illustrated in FIG. 4, and FIG. 6 is a diagram exemplifying a lookup table of an emulator.

Referring to FIGS. 4 and 5, after the measurement device 121 and the transformer data unit 131 are connected, the emulator 141 may be connected to the transformer data unit 131 (S110).

Then, the emulator 141 may detect the measurement device ID that is stored in the first memory 125 of the measurement device 121 (S120), and may detect the transformer data unit ID that is stored in the second memory 135 of the transformer data unit 131 (S130).

Then, the emulator 141 may extract the characteristic values corresponding to the measurement device ID and the transformer data unit ID from the internal lookup table 145 (S140), and may correct the error by performing calibration of the measurement device 121 and the transformer data unit 131 in accordance with the extracted characteristic value (S150).

That is, as illustrated in FIG. 6, a plurality of characteristic values $\alpha 1$ to $\gamma n$, which correspond to a plurality of measurement device IDs ID_P1 to ID_Pm and transformer data unit IDs ID_T1 to ID_Tn, are stored in the lookup table 145 of the emulator 141.

For example, if ID_P1 is detected from the first memory 125 of the measurement device 121 as the measurement device ID, and ID_T1 is detected from the second memory 135 of the transformer data unit 131 as the transformer data unit ID, the emulator 141 may extract $\alpha 1$ from the lookup table 145 as the characteristic value.

Further, the emulator 141 may correct the error by performing the calibration of the measurement device 121 and the transformer data unit 131 in accordance with the extracted characteristic value $\alpha 1$.

As described above, the system 101 for correcting an error according to the embodiments of the present disclosure can correct the error of the measurement device 121 and the transformer data unit 131 by performing the calibration between the measurement device 121 and the transformer data unit 131 using the characteristic values extracted according to the ID information stored therein even if the measurement device 121 and the transformer data unit 131 are connected in the random combination.

According to the system 101 for correcting an error according to some embodiments of the present disclosure, in comparison to the system in the related art, it is possible to replace only one of the transformer data unit 131 and the measurement device 121, and thus the time consumption and the cost occurrence caused by the replacement can be reduced.

On the other hand, since the system for correcting an error according to still another embodiment can correct the error of the measurement device and the transformer data unit through the calibration using the emulator, the measurement device and the transformer data unit can be randomly combined. Accordingly, the measurement device and the transformer data unit can be easily replaced, and thus the time and the cost required for the repair can be reduced.

Although the present disclosure includes been described with reference to some embodiments in the attached figures, it is to be understood that various equivalent modifications and variations of the embodiments can be made by a person including an ordinary skill in the art without departing from the spirit and scope of the present disclosure. The scope of the present disclosure could be defined by the appended claims and their equivalents.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A system for correcting an error for a transformer load monitoring system comprising:

a measurement device connected to a secondary output line of a transformer and configured to measure current that is output from the transformer;

a transformer data unit configured to determine a usage rate and an overload state through calculation of a load amount for a capacity of the transformer in accordance with the current that is measured by the measurement device; and an emulator connected to the transformer data unit and configured to perform error correction between the measurement device and the transformer data unit through performing calibration at least once, wherein the emulator is separate from and independent of the measurement device, wherein the measurement device and the transformer data unit are each provided with a measurement device and a transformer data ID, respectively, and wherein the emulator is configured to:

detect the measurement device ID provided from the measurement device and the transformer data unit ID if the transformer data unit is connected, extract a characteristic value which corresponds to the measurement device ID and the transformer data unit ID among characteristic values stored in a lookup table, calibrate the measurement device and the transformer data unit with respect to at least three points within a current measurement range using the characteristic value, and perform error correction on each of the current output from the measurement device and the current input into the transformer data unit, respectively.

2. The system for correcting an error according to claim 1, wherein the current measurement range is 0 to 760 A, and the three points are points of 5 A, 150 A, and 650 A.

3. The system for correcting an error according to claim 1, wherein the measurement unit includes a first memory in which the measurement device ID is stored, wherein the transformer data unit includes a second memory in which the measurement transformer data unit ID is stored, and wherein the emulator includes the lookup table in which the characteristic values according to the measurement device ID and the transformer data unit ID are stored.

* * * * *